United States Patent [19]

Ostertag

[11] Patent Number: 4,862,070
[45] Date of Patent: Aug. 29, 1989

[54] APPARATUS FOR TESTING INPUT PIN LEAKAGE CURRENT OF A DEVICE UNDER TEST

[75] Inventor: Edward A. Ostertag, Thousand Oaks, Calif.

[73] Assignee: Teradyne, Inc., Boston, Mass.

[21] Appl. No.: 115,156

[22] Filed: Oct. 30, 1987

[51] Int. Cl.[4] .................... G01R 31/00; G01R 15/12
[52] U.S. Cl. ............................... 324/73 R; 324/158 R
[58] Field of Search ........... 324/73 DC, 73 R, 158 R, 324/66, 158 F; 371/20, 25, 21

[56] References Cited

U.S. PATENT DOCUMENTS

| | | | |
|---|---|---|---|
| 3,916,306 | 10/1975 | Patti | 324/73 R X |
| 4,021,112 | 5/1977 | Wilson | 324/158 D X |
| 4,092,589 | 5/1978 | Chau et al. | 324/73 R X |
| 4,504,783 | 3/1985 | Zasio et al. | 324/158 F X |
| 4,506,212 | 3/1985 | Melia | 324/73 R X |
| 4,517,512 | 5/1985 | Petrich et al. | 324/158 F X |
| 4,651,088 | 3/1987 | Sawada | 324/73 R X |
| 4,710,927 | 12/1987 | Miller | 324/73 R X |
| 4,724,379 | 2/1988 | Hoffman | 324/73 R X |
| 4,739,252 | 4/1988 | Malaviya et al. | 324/158 D X |

Primary Examiner—Reinhard J. Eisenzopf
Assistant Examiner—Vinh P. Nguyen

[57] ABSTRACT

Apparatus for testing leakage currents of input pins of an electronic device under test including a connector having a plurality of contacts for making electrical contact to respective input pins, a plurality of current measuring circuits connected to respective contacts of the connector for sensing leakage currents and providing analog outputs indicating current, a multiplexer connected to receive the analog outputs and selectively provide one analog output as a multiplexer output, and an analog-to-digital converter connected to receive the multiplexer output and provide a digital output indicating leakage current. Also disclosed are storing a limit value for each pin in a limit memory and comparing the limit values with the multiplexer outputs; using a plurality of digital-to-analog converters to selectively provide desired inputs to the input pins; and using a correction memory storing a correction value for each pin to correct the multiplexer output.

21 Claims, 2 Drawing Sheets

APPARATUS FOR TESTING INPUT PIN LEAKAGE CURRENT OF A DEVICE UNDER TEST

FIELD OF THE INVENTION

The present invention relates to measuring leakage currents of the input pins of a device under test.

BACKGROUND OF THE INVENTION

Often when testing an electronic device, the leakage currents of the device's input pins are measured to determine whether the currents are within specified limits.

One prior art method of testing leakage currents involves using one precision current measuring circuit for all the pins. The measuring circuit is connected to one pin, and the measurements are performed. It is then disconnected from this pin and connected to the next pin to be tested. This procedure is repeated until all the pins on the board have been tested.

Another prior art method of testing input leakage currents involves using one precision current measuring circuit per input pin.

SUMMARY OF THE INVENTION

In one aspect the invention features providing a plurality of current measuring circuits for input pins of a device under test and selectively connecting the analog output signals of these current measuring circuits through a multiplexer to a single analog-to-digital (A/D) converter, permitting the leakage currents of the input pins to be quickly and accurately measured using a single A/D converter. In preferred embodiments there is a separate current measuring circuit for each pin; there is a result memory for storing the digital outputs; the memory and multiplexer are synchronized by a counter; each current measuring circuit includes an operational amplifier and a capacitor connected between an input and an output of the operational amplifier; and the current measuring circuit integrates the leakage current over a time period equal to an integer multiple of the predominant background power distribution line frequency.

In another aspect the invention features employing a plurality of current measuring circuits, a multiplexer for selectively providing one of the outputs of the current measuring circuits as its output, a limit memory storing a limit value for each input pin, and a comparing circuit to compare each multiplexer output, indicating leakage current of a pin, with the respective limit value for the pin. In preferred embodiments there is a pass/fail memory for storing the pass/fail information and a mask memory to prevent indicating failures for current measuring circuits that are not connected to input pins.

In another aspect the invention features employing a plurality of current measuring circuits and a plurality of digital-to-analog converters to selectively provide desired inputs to the pins In another aspect the invention features employing a plurality of measuring circuits, a multiplexer for selectively providing one of the outputs of the current measuring circuits as its output, a correction memory storing a correction value for each current measuring circuit, and means to correct the multiplexer output based upon the respective correction value. In preferred embodiments there are both offset and gain correction values, which are stored in offset and gain memories.

Other advantages and features of the invention will be apparent from the following description of the preferred embodiment thereof and from the claims.

DESCRIPTION OF THE PREFERRED EMBODIMENT

The preferred embodiment will now be described.

DRAWINGS

STRUCTURE

Figure 1:
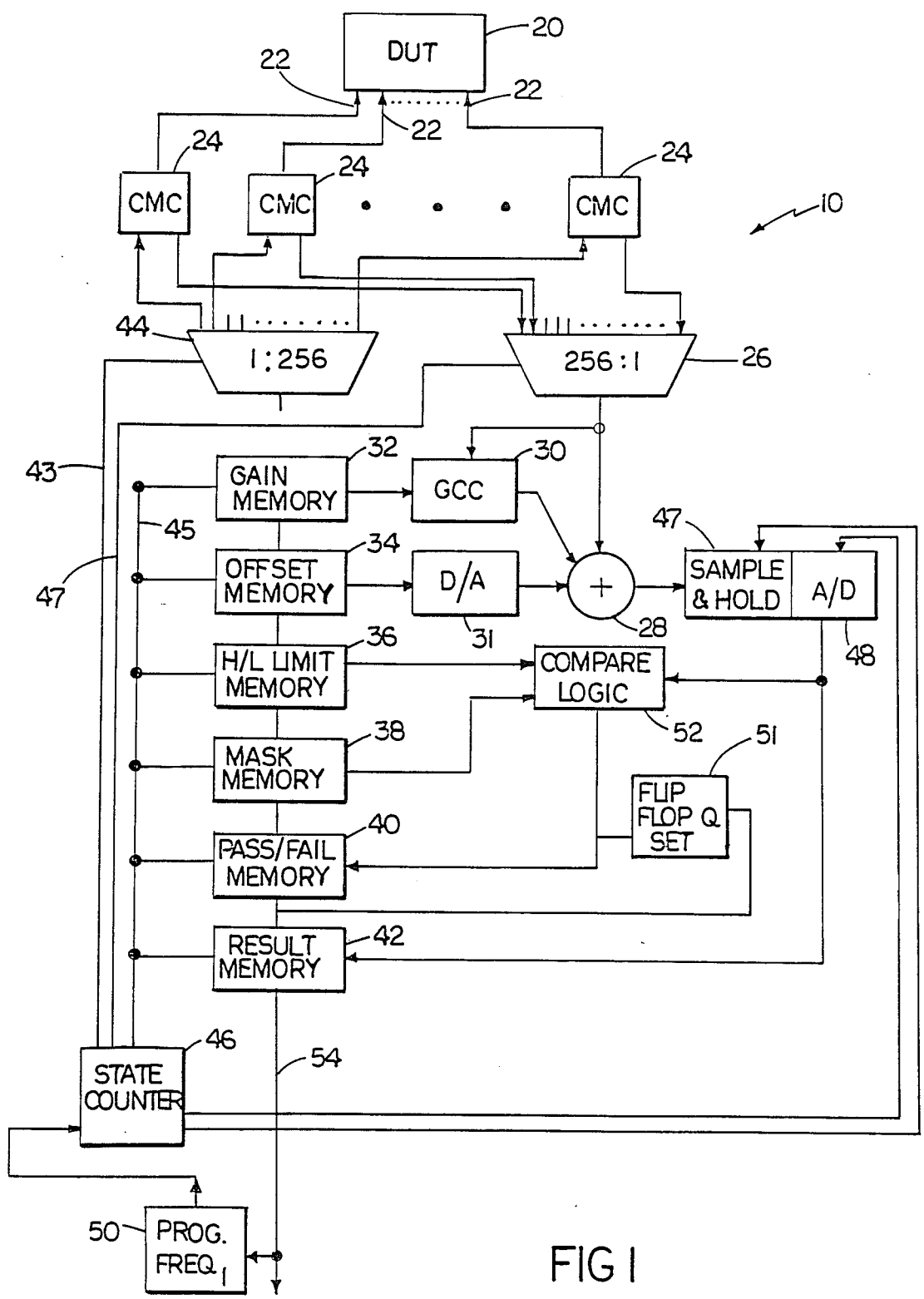
FIG. 1 is a block diagram of leakage current testing apparatus according to the invention.

Referring to FIG. 1, there is shown leakage current testing apparatus 10 for testing input leakage currents of device under teset (DUT) 20. A plurality of current measuring circuits 24 are connected via connector contacts 22 to input pins of DUT 20. The analog outputs of current measuring circuits 24 are connected to 256:1 analog multiplexer 26, the output of which is passed to 12-bit analog-to-digital (A/D) converter 48, after adding gain and offset correction factors at summer 28 and sampling at sample and hold circuit 47.

The analog output of multiplexer 26 is inputted into both analog summer 28 and gain correction circuit 30. Gain correction circuit 30 is also inputted with the digital correction output from gain memory 32. Summer 28 is also inputted with the analog correction outputs from both gain correction circuit 30 and offset digital-to-analog (D/A) converter 31, which is input with the digital offset correction output of offset memory 34.

Gain memory 32, offset memory 34, high/low limit memory 36, mask memory 38, pass/fail memory 40, and result memory 42 are all random access memories addressed by the digital output of state counter 46 via address bus 45. Demultiplexer 44 and multiplexer 26 are addressed by their respective address buses 43, 47, connected to state counter 46. State counter 46 is clocked by programmable frequency generator 50. Sample and hold circuit 47, which outputs to analog-to-digital converter (A/D) 48, are clocked by further outputs of state counter 46. The output of A/D converter 48, indicating the magnitude of the measured leakage current, is inputted into compare logic circuit 52 (for comparison with predetermined limits) and result memory 42 (for storage and later retrieval). Gain memory 32, offset memory 34, high/low memory 36, mask memory 38, pass/fail memory 40, result memory 42, programmable frequency generator 50, and device reject flip-flop 51 are all connected to data bus 54.

Figure 2:
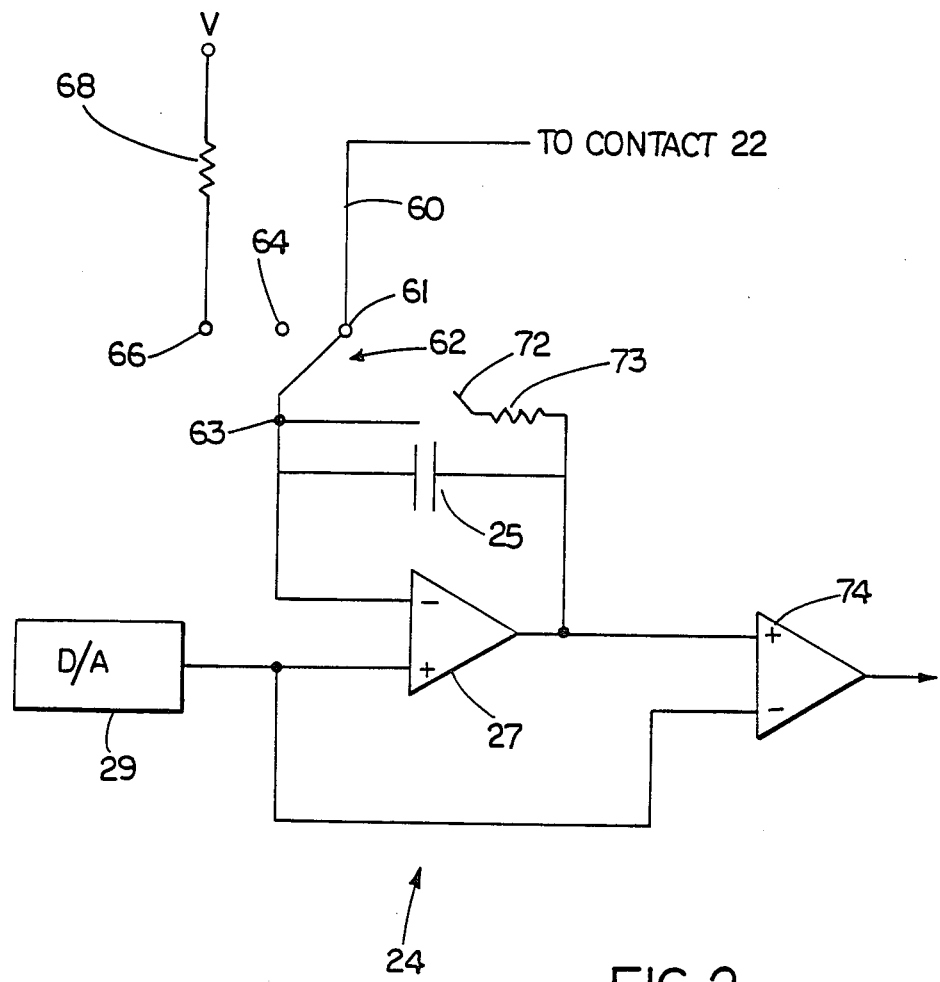
FIG. 2 is a simplified schematic diagram of a current measuring circuit of the FIG. 1 apparatus.

Referring to FIG. 2, current measuring circuit 24 has capacitor 25 and switch 72 connected in parallel between the output of operational amplifier 27 and the inverting input of operational amplifier 27. Resistor 73 is connected in series with switch 72. Contact 22, connected to an input pin of DUT 20, is connected via line 60 to node 61 of switch circuit 62, shown diagrammatically as a three-position switch in FIG. 2. Node 63 of switch 62 is connected to the inverting input of operational amplifier 27. Node 64 of switch 62 is open, and node 66 of switch 62 is connected to precision resistor 68, which is inputted with a controlled voltage. D/A converter 29, used to provide desired input voltage (e.g., high or low) to an input pin, is connected to the non-inverting input of operational amplifier 27. The outputs of operational amplifier 27 and D/A converter 29 are provided to the non-inverting and inverting inputs, respectively, of differential amplifier 74.

OPERATION

During a system calibration procedure, current measuring circuits 24 are calibrated by calculating gain and offset correction voltages for each, the correction voltages being represented by digital numbers stored in memories 32, 34. Offset and gain correction voltages are determined as follows.

For each current measuring circuit 24, switch 62 is connected to node 64 so that no current is inputted to the measuring circuit from line 60. D/A converter 29 is set to the desired input voltage. The output of differential amplifier 74 (a voltage proportional to the integral of the current charging capacitor 25) is then measured at a particular time by sampling at sample and hold circuit 47 and converting to a digital number at A/D converter 48, as explained in detail later. This digital number, indicating the voltage of the current measuring circuit when it has been disconnected from its input pin (a zero leakage current situation), is the offset that is stored in offset memtory 34 at an address corresponding to the respective current measuring circuit.

After the offset voltage has been measured, switch 62 is switched to node 66 to connect precision resistor 68 to operational amplifier 27. A voltage is applied to precision resistor 68 such that a known input current is provided to capacitor 25 and the inverting terminal of operational amplifier 27. The output of D/A converter 29 is subtracted from the output of operational amplifier 27 at differential amplifier 74. The output of differential amplifier 74 (a voltage that ramps at a rate directly related to current) is added to the offset correction voltage provided by D/A converter 31 to summer 28, and the combined voltage is sampled at a particular time. The gain of operational amplifier is ascertained by comparing the measured value with the known input current, and a gain correction value is stored in gain memory 32 for each current measuring device 24.

Before actual leakage current tests are performed, high/low limit memory 36 and mask memory 38 are loaded via data bus 54. High/low limit memory 36 is loaded with the high and low limits of each input pin of DUT 20 (e.g., those specified by the manufacturer). Mask memory 38 is loaded with the pin pattern of DUT 20 so that unused current measuring circuits 24 will not cause failure designations.

After memories 36 and 38 have been loaded, and D/A converters 29 have been set, counter 46 counts from 1 to 256 on address bus 43, causing 1:256 demultiplexer 44 to sequentially activate individual current measuring circuits 24 by opening switch 72, thereby causing capacitor 25 to be charged and differential amplifier 74 to output a voltage (V) that ramps at a rate directly related to leakage current (I) from the pin: $V = I/C * time$.

Current measuring circuits 24 are generally permitted to ramp for $1/60^{th}$ of a second or for $1/6^{th}$ of a second for 60 Hz line frequency or $1/50^{th}$ or $1/5^{th}$ of a second for 50 Hz line frequency (or other integer multiples of the predominant background power distribution line frequency), depending on the magnitude of the current and the accuracy desired. The ramp time periods are set equal to integer multiples of the line frequency so that any noise caused by electromagnetic fields emanating from power supplies is integrated to zero. The choice of the length of the ramp period affects both resolution and range. E.g., at a $1/6^{th}$ second ramp period, the range is ±200 nanoamps, and the resolution (provided by 12 bits) is 100 picoamps; at a $1/60^{th}$ second ramp period, the range is ±2 microamps, and the resolution is 1 nanoamp. The loss of resolution in going to the shorter ramp period is, however, to some extent offset by the fact that the larger currents that are probably being measured are less susceptible to currents induced by background electromagnetic noise. Also, if it is necessary to shorten the ramp period to less than the $1/60^{th}$ or $1/50^{th}$ second periods in order to measure currents greater than 2 microamps (e.g., a $1/600^{th}$ or $1/500^{th}$ second period is also used), the noise currents start to be insignificant. To measure higher currents, switch 72 remains closed, and the voltage output of differential amplifier 74 (which is proportional to leakage current times resistance of resistor 73) is simply sampled (after correction) without integration.

The providing of digital outputs 1 to 256 by state counter 46 over address bus 43 to demultiplexer 44 to initiate ramping of measuring circuits 24 is spread out over the ramp period. As soon as the 256th measuring circuit 24 has been initiated, counter 46 again counts from 1 to 256, but this time providing the outputs over buses 47, 45 to connect the output of each current measuring circuit 24 through multiplexer 26 and to address respective storage locations in memories 32–42. As state counter 46 is clocked by programmable frequency generator 50, the speed of counting, and thus the ramp period, can be easily changed simply by changing the frequency of the output of frequency generator 50. In this manner each current measuring circuit 24 is sequentially connected to A/D converter 48, and the output of each current measuring circuit 24 is thus measured in turn. Because 256:1 multiplexer 26 and memories 32–42 are simultaneously addressed by state counter 46, all the signal corrections and data transfers are synchronized. As the "address" of each current measuring circuit 24 appears on address buses 47, 45, the analog output of that circuit 24 is passed in turn through 256:1 multiplexer 26; the appropriate correction factors are read from gain and offset memories 32, 34; the appropriate limits and mask information are read from high/low limit memory 36 and mask memory 38; pass/fail information and measured currents are written at appropriate addresses in pass/fail memory 40 and result memory 42. The analog output of 256:1 multiplexer 26 is inputted into gain correction circuit 30, which utilizes information from gain memory 32 to produce a voltage that, when added to that from the current measuring circuit, corrects for the gain produced by operational amplifier 27. This gain correction voltage is summed with the offset correction voltage (based upon the number stored in offset memory 34 and provided by D/A converter 31) and the analog signal output from multiplexer 26 at summer 28. The output of summer 28 is a corrected voltage corresponding to leakage current from the input pin connected to contact 22. The corrected voltage outputted from summer 28 is ramping and is sampled precisely at the end of the ramp period by sample and hold circuit 47, which then provides a constant voltage output long enough for digitization by A/D converter 48. Both sample and hold circuit 47 and A/D converter 48 are activated at the appropriate time by timing signals from state counter 46. The digital leakage current signal from A/D converter 48 is both stored in result memory 42 (to provide the actual leakage current value) and compared with the high and low limits for that pin at compare logic 52. The results of this comparison are stored in pass/fail memory 40 and will set device reject flip-flop 51 if a failure is indicated. Thus only the output of flip-flop 51 need be checked to see of DUT 20 meets specifications, the usual situation.

If it is desired to test leakage current at different input voltages, D/A converters 29 are reset accordingly, and the procedure is repeated.

Because all input pins are simultaneously connected to their respective current measuring circuits, and all current measuring circuits are simultaneously ramping, the testing is much faster than when each device must be connected separately (and permitted to settle), and when the currents are measured one after another. The use of the multiplexer to connect the various current measuring circuits in turn permits use of a single A/D converter, a single sample and hold circuit, a single associated correction circuit, and a single comparison circuit for all input pins. Because the measured leakage currents are stored, there is no need to subsequently retest failed pins using, e.g., different comparison limits, to determine the magnitude of a leakage current. By using individual D/A converters 29, each current measuring circuit 24 may drive its corresponding contact 22 at a different input voltage, permitting one, e.g., to provide high and low inputs to alternate pins.

Other embodiments of the invention are within the scope of the following claims. E.g., each current measuring circuit 24 could be shared by a small number of input pins that would be selectively connected.

What is claimed is:

1. Apparatus for testing leakage currents of input pins of an electronic device under test comprising
   a connector having a plurality of contacts for making electrical contact to respective said input pins,
   a plurality of current measuring circuits connected to respective contacts of said connector for sensing leakage current magnitudes and providing analog outputs having magnitudes indicating said leakage current magnitudes,
   a multiplexer connected to receive said analog outputs and selectively provide one said analog output as a multiplexer output, and
   an analog-to-digital converter connected to receive said multiplexer output and provide a digital output indicting a magnitude of a leakage current.

2. The apparatus of claim 1, further comprising:
   a limit memory for storing a limit value for each said pin, said limit memory being selectively addressable to present a said limit value corresponding to the pin that corresponds to said one analog output, and
   a comparing circuit connected to receive and compare a limit signal based on said limit value with said digital output.

3. The apparatus of claim 2 further comprising:
   a plurality of digital-to-analog converters connected to respective contacts of said connector to selectively provide desired inputs to said input pins,
   a correction memory means for storing a correction value for each said pin, said correction memory being selectively addressable to present a said correction value corresponding to the current measuring circuit providing said one analog output, and
   means to correct said multiplexer output based on said correction value.

4. The apparatus of claim 1, 2 or 3 further comprising a result memory for storing said digital output of said analog-to-digital converter for each said pin.

5. The apparatus of claim 1, 2, or 3 wherein said memories and said multiplexer are synchronized by a counter.

6. The apparatus of claim 1 further comprising a plurality of digital-to-analog converters connected to respective contacts of said connector to selectively provide desired inputs to said input pins.

7. The apparatus of claim 1 further comprising:
   a correction memory for storing a correction value for each said pin, said correction memory being selectively addressable to present a said correction value corresponding to the current measuring circuit providing said one analog output, and
   means to correct said multiplexer output based on said correction value.

8. Apparatus for testing leakage currents of input pins of an electronic device under test comprising
   a connector having a plurality of contacts for making electrical contact to respective said input pins,
   a plurality of current measuring circuits connected to respective contacts of said connector for sensing leakage current magnitudes and providing analog outputs having magnitudes indicating said leakage current magnitudes,
   a multiplexer connected to receive said analog outputs and selectively provide one said analog output as a multiplexer output,
   a limit memory for storing a limit value for each said pin, said limit memory being selectively addressable to present a said limit value corresponding to the pin that corresponds to said one analog output,
   an analog-to-digital converter connected to receive said multiplexer output and to provide a multiplexer output signal, and
   a comparing circuit connected to receive and compare said limit value with said multiplexer output.

9. the apparatus of claim 8 further comprising a pass/fail memory for storing pass/fail information, said pass/fail memory being selectively addressable to store said pass/fail information from said comparing circuit, and
   a mask memory for storing mask information about the absence of input pins at certain current measuring circuits, said mask memory being selectively addressable to present said mask information to said comparing circuit to prevent indicating failures for contacts that are not connected to input pins.

10. Apparatus for testing leakage currents of input pins of an electronic device under test comprising
    a connector having a plurality of contacts for making electrical contact to respective said input pins,
    a plurality of current measuring circuits connected to respective contacts of said connector for sensing leakage current magnitudes and providing analog outputs having magnitudes indicating current magnitudes,
    a multiplexer connected to receive said analog outputs and selectively provide one said analog output as a multiplexer output, and
    a plurality of digital-to-analog converters, said plurality of digital-to-analog converters outputting respective digital-to-analog converter signals upon which respective input signals are based, said input signals being inputted to respective contacts of said connector to selectively provide desired inputs to said input pins.

11. Apparatus for testing leakage currents of input pins of an electronic device under test comprising
a connector having a plurality of contacts for making electrical contact to respective said input pins,
a plurality of current measuring circuits connected to respective contacts of said connector for sensing leakage current magnitudes and providing analog outputs having magnitudes indicating current,
a multiplexer connected to receive said analog outputs and selectively provide one said analog output as a multiplexer output,
a correction memory means for storing a correction value for each said pin, said correction memory being selectively addressable to present a said correction value corresponding to the current measuring circuit providing said one analog output, and
means to correct said multiplexer output based on said correction value.

12. The apparatus of claim 11 wherein each said current measuring circuit has a corresponding analog offset, and said correction value includes an offset value for generating an offset signal correcting for said analog offset.

13. The apparatus of claim 11 or 12 wherein each said current measuring circuit has a corresponding gain, and said correction value includes a gain value for generating a gain signal for correcting for said gain.

14. The apparatus of claim 11 further comprising means for generating said correction value included in each of said plurality of current measuring circuits and wherein said correction value is stored in said correction memory.

15. The apparatus of claim 1, 8, 10, 11, or 9 wherein said multiplexer is sequentially actuated.

16. The apparatus of claim 8, 11, 12, or 9 wherein each said memory is synchronized with said multiplexer.

17. The apparatus of claim 1, 8, 10, or 11 wherein each said current measuring circuit integrates its respective said leakage current, and further comprising means to sample said multiplexer output when there has been integration over a time period equal to an integer multiple of the predominant background power distribution line frequency to cancel out the noise caused by electromagnetic fields emanating from power supplies.

18. The apparatus of claim 1, 8, 10, or 11 wherein each said current measuring circuit comprises
an operational amplifier, and
a capacitor connected between an input and an output of said operational amplifier.

19. The apparatus of claim 1, 8, 10, or 11 further comprising,
a demultiplexer connected to said current measuring circuits, said demultiplexer controlling activation of said current measuring circuits.

20. The apparatus of claim 1, 8, 10, or 11 wherein there is a separate said current measuring circuit for each pin.

21. The apparatus of claim 1, 8, 10, or 11 wherein each said current measuring circuit integrates each said leakage current, and further comprising means to sample said multiplexer output when there has been integration over a desired time period, a state counter connected to control sampling of said means to sample, and a programmable frequency generator connected to clock said state counter so as to control said time period as a function of the frequency of the frequency generator output.

* * * * *